(12) United States Patent
Whitaker

(10) Patent No.: US 9,812,197 B2
(45) Date of Patent: Nov. 7, 2017

(54) CLAMP CIRCUIT

(71) Applicant: HEWLETT PACKARD ENTERPRISE DEVELOPMENT LP, Houston, TX (US)

(72) Inventor: Luke Whitaker, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/316,060

(22) PCT Filed: Oct. 20, 2014

(86) PCT No.: PCT/US2014/061375
§ 371 (c)(1),
(2) Date: Dec. 2, 2016

(87) PCT Pub. No.: WO2016/064375
PCT Pub. Date: Apr. 28, 2016

(65) Prior Publication Data
US 2017/0110187 A1    Apr. 20, 2017

(51) Int. Cl.
*G11C 11/00* (2006.01)
*G11C 13/00* (2006.01)

(52) U.S. Cl.
CPC .................. *G11C 13/004* (2013.01)

(58) Field of Classification Search
CPC ............ G11C 13/0004; G11C 13/0069; G11C 13/004
USPC ................................................ 365/148, 207
See application file for complete search history.

(56) References Cited

U.S. PATENT DOCUMENTS

| | | |
|---|---|---|
| 6,437,956 B1 | 8/2002 | Montrose |
| 2010/0290301 A1 | 11/2010 | Scheuerlein |
| 2012/0194264 A1 | 8/2012 | Chamakura |
| 2012/0254541 A1 | 10/2012 | Beckmann et al. |
| 2013/0223134 A1 | 8/2013 | Yi et al. |
| 2013/0279237 A1 | 10/2013 | Huang et al. |
| 2014/0003124 A1 | 1/2014 | Youn et al. |

FOREIGN PATENT DOCUMENTS

JP    2012203946    10/2012

OTHER PUBLICATIONS

Chang, M-F. et al., A High-Speed 7.2-ns. Read-Write Random Access 4-Mb Embedded Resistive RAM (ReRAM) Macro Using Process-Variation-Tolerant Current-Mode Read Schemes, (Research Paper), Mar. 2013, pp. 878-891.
International Search Report and Written Opinion; PCT/US2014/061375; dated Jun. 16, 2015; 10 pages.

*Primary Examiner* — Huan Hoang
(74) *Attorney, Agent, or Firm* — Dicke, Billig & Czaja, PLLC

(57) ABSTRACT

One example provides a device including a first transistor having a source-drain path electrically coupled between a first node and a second node. The device includes an operational amplifier having an output electrically coupled to a gate of the first transistor. The operational amplifier controls the first transistor to maintain a predetermined voltage on the first node. A first current source adds a current at the first node and a second current source subtracts the current at the second node.

12 Claims, 9 Drawing Sheets

CLAMP CIRCUIT

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element. One type of resistive memory uses memristors as the memory elements.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Examples of the disclosure provide a bandwidth enhanced clamp circuit for a resistive memory, such as a memristor memory. The bandwidth enhanced clamp circuit is electrically coupled between a first node and a second node. The first node is electrically coupled to a resistive memory array and the second node is electrically coupled to a sense amplifier. The clamp circuit maintains a predetermined voltage on the first node between the resistive memory array and the clamp circuit. The clamp circuit includes a first transistor having a source-drain path electrically coupled between the first node and the second node, a first current source to add a current at the first node, and a second current source to subtract, in a first state, the current at the second node. The clamp circuit also includes a second transistor having a source-drain path, a first side of the source-drain path of the second transistor electrically coupled to the second node. The second transistor mirrors the second current source in the first state to subtract the second current at the second node and is electrically disconnected from the second current source and diode connected in a second state to provide a load.

Figure 1:
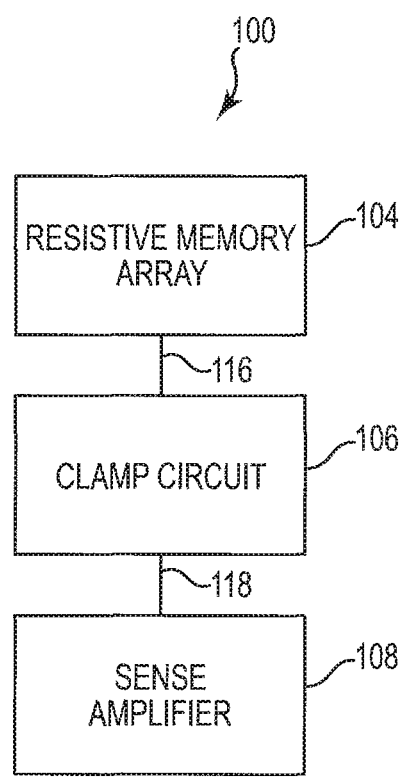
FIG. 1 is a block diagram illustrating one example of a system.

FIG. 1 is a block diagram illustrating one example of a system 100. System 100 includes a resistive memory array 104, a clamp circuit 106, and a sense amplifier 108. Resistive memory array 104 is electrically coupled to clamp circuit 106 through a signal path 116. Clamp circuit 106 is electrically coupled to sense amplifier 108 through a signal path 118.

System 100 is part of a device that uses memory, such as a computer, tablet, smart phone, or other suitable device. Resistive memory array 104 includes a one dimensional array of resistive memory cells, a two dimensional array of resistive memory cells, or a three dimensional array of resistive memory cells. In one example, each memory element of resistive memory array 104 includes a memristor. In other examples, each memory element of resistive memory array 104 includes a phase change memory cell, a programmable metallization cell, or other suitable resistive memory cell. Resistive memory array 104 utilizes the resistance value of each memory element to store one or more bits of data.

Clamp circuit 106 maintains a predetermined voltage on signal path 116. Clamp circuit 106 maintains a high bandwidth and remains stable throughout wide current swings of resistive memory array 104 due to the memory cell resistance variation. Clamp circuit 106 also provides a high operating speed by eliminating the need for a pre-charge phase between memory operations.

Sense amplifier 108 senses the current from resistive memory array 104. In a first state, sense amplifier 108 senses the leakage current of resistive memory array 104. In a second state, sense amplifier 108 senses the current through a selected resistive memory cell of resistive memory array 104.

Figure 2:
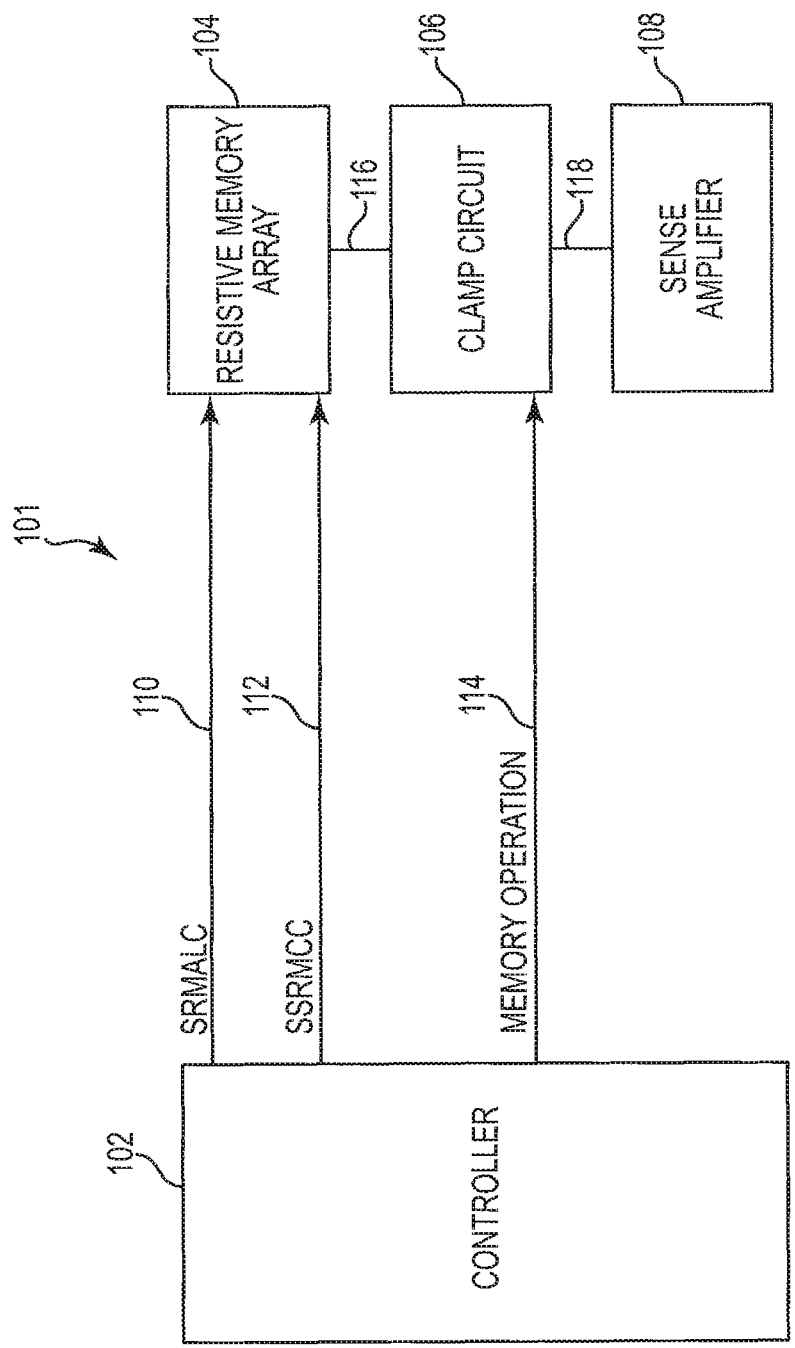
FIG. 2 is a block diagram illustrating another example of a system.

FIG. 2 is a block diagram illustrating another example of a system 101. System 101 includes a controller 102, resistive memory array 104, clamp circuit 106, and sense amplifier 108. Controller 102 is electrically coupled to resistive memory array 104 through a Sample Resistive Memory Array Leakage Current (SRMALC) signal path 110 and a Sample Selected Resistive Memory Cell Current (SSRMCC) signal path 112. Controller 102 is electrically coupled to clamp circuit 106 through a memory operation signal path 114.

System 101 is part of a device that uses memory, such as a computer, tablet, smart phone, or other suitable device. Controller 102 may include a processor, an Application Specific Integrated Circuit (ASIC), or other suitable logic circuitry for controlling resistive memory array 104, clamp circuit 106, and sense amplifier 108. Controller 102 provides a SRMALC signal and a SSRMCC signal to resistive memory array 104 and provides a memory operation signal to clamp circuit 106. In other examples, controller 102 may provide other signals to resistive memory array 104, clamp circuit 106, and/or sense amplifier 108 for controlling system 101.

In operation, in response to a logic high memory operation signal and a logic high SRMALC signal from controller 102, the leakage current of resistive memory array 104 is sensed by sense amplifier 108 through clamp circuit 106 as will be further described below with reference to FIG. 4A. In response to a logic high memory operation signal and a logic high SSRMCC signal from controller 102, the memory cell current of a selected resistive memory cell of memory array 104 is sensed by sense amplifier 108 through clamp circuit 106 as will be further described below with reference to FIG. 4B. In response to a logic low memory operation signal from controller 102, resistive memory array 104, clamp circuit 106, and sense amplifier 108 are in a between memory operations state as will be further described below with reference to FIG. 4C.

Figure 3:
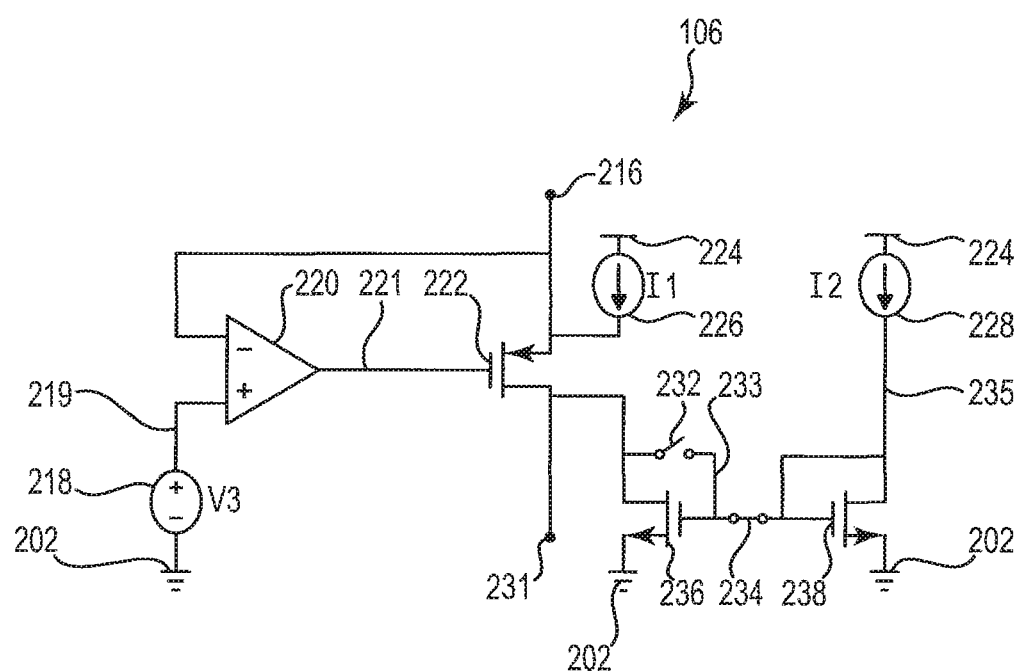
FIG. 3 is a schematic diagram illustrating one example of a clamp circuit.

FIG. 3 is a schematic diagram illustrating one example of a clamp circuit 106. Clamp circuit 106 includes a voltage source (V3) 218, an operational amplifier 220, a first current source (I1) 226, a second current source (I2) 228, transistors 222, 236, and 238, and switches 232 and 234. In one example, transistor 222 is a p-channel field effect transistor and transistors 236 and 238 are n-channel field effect transistors. In one example, switches 232 and 234 are transistor switches, such as transmission gates, or other suitable switches controlled by respective control signals.

The negative terminal of voltage source 218 is electrically coupled to common or ground 202. The positive terminal of voltage source 218 is electrically coupled to the non-inverting input of operational amplifier 220 through a signal path 219. The inverting input of operational amplifier 220 is electrically coupled to a first node 216. The output of operational amplifier 220 is electrically coupled to the gate of transistor 222 through a signal path 221. The source-drain path of transistor 222 is electrically coupled between first node 216 and a second node 231. One terminal of first current source 226 is electrically coupled to a reference voltage 224. The other terminal of first current source 226 is electrically coupled to first node 216.

One terminal of second current source 228 is electrically coupled to reference voltage 224. The other terminal of second current source 228 is electrically coupled to one side of the source-drain path of transistor 238, the gate of transistor 238, and one side of switch 234 through a signal path 235. The other side of the source-drain path of transistor 238 is electrically coupled to common or ground 202. The other side of switch 234 is electrically coupled to the gate of transistor 236 and one side of switch 232 through a signal path 233. The source-drain path of transistor 236 is electrically coupled between common or ground 202 and second node 231. The other side of switch 232 is electrically coupled to second node 231.

Operational amplifier 220 controls transistor 222 to maintain a predetermined voltage on first node 216 based on feedback from first node 216 and the bias voltage provided by voltage source 218. In one example, voltage source 218 provides 1.44V.

First current source 226 adds a current on first node 216. In one example, current source 226 provides 160 μA. Second current source 228, and transistors 236 and 238 provide a current mirror when switch 232 is open and switch 234 is closed. In one example, second current source 228 provides substantially the same current as first current source 226, such as 160 μA. With switch 232 open and switch 234 closed, a current substantially equal to the current provided by second current source 228 is subtracted from second node 231. In this way, the current added at first node 216 is subtracted at second node 231 such that the current sensed by sense amplifier 108 substantially equals the current from resistive memory array 104.

With switch 232 closed and switch 234 open, second current source 228 is electrically disconnected from transistor 236, and transistor 236 is diode connected to provide a load. In this way, the current from first current source 226 flows through transistors 222 and 236 to maintain a voltage bias on both sides of transistor 222 such that a pre-charge phase is not needed.

Figure 4A:
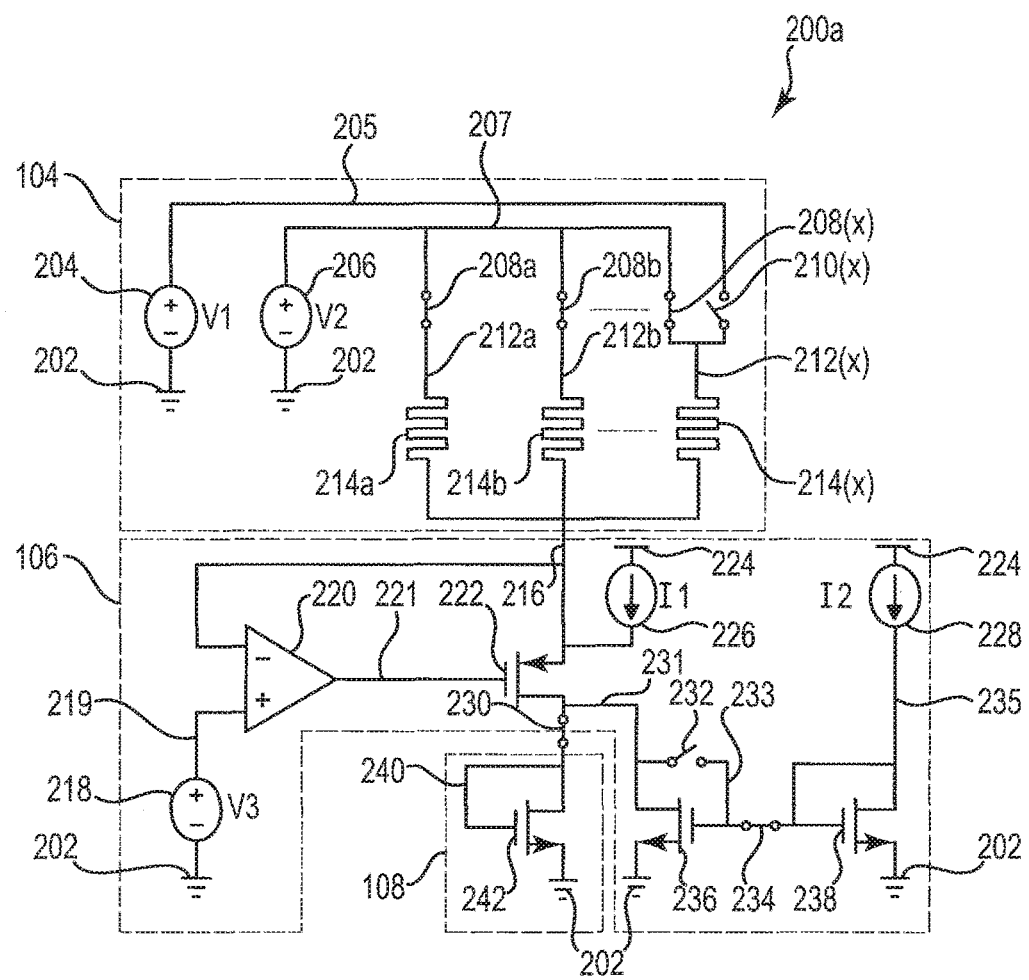
FIGS. 4A-4C are schematic diagrams illustrating one example of the system in different states.
Figure 4B:
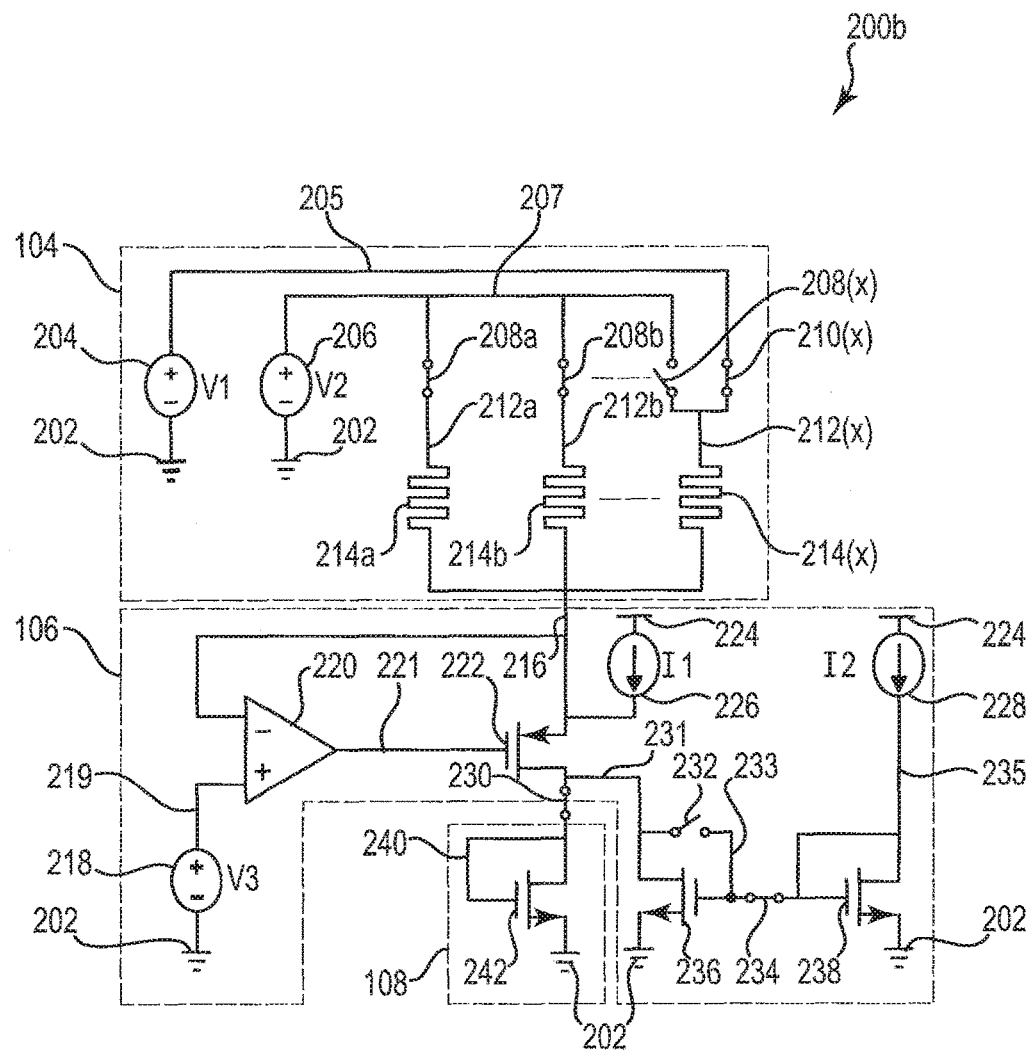
Figure 4C:
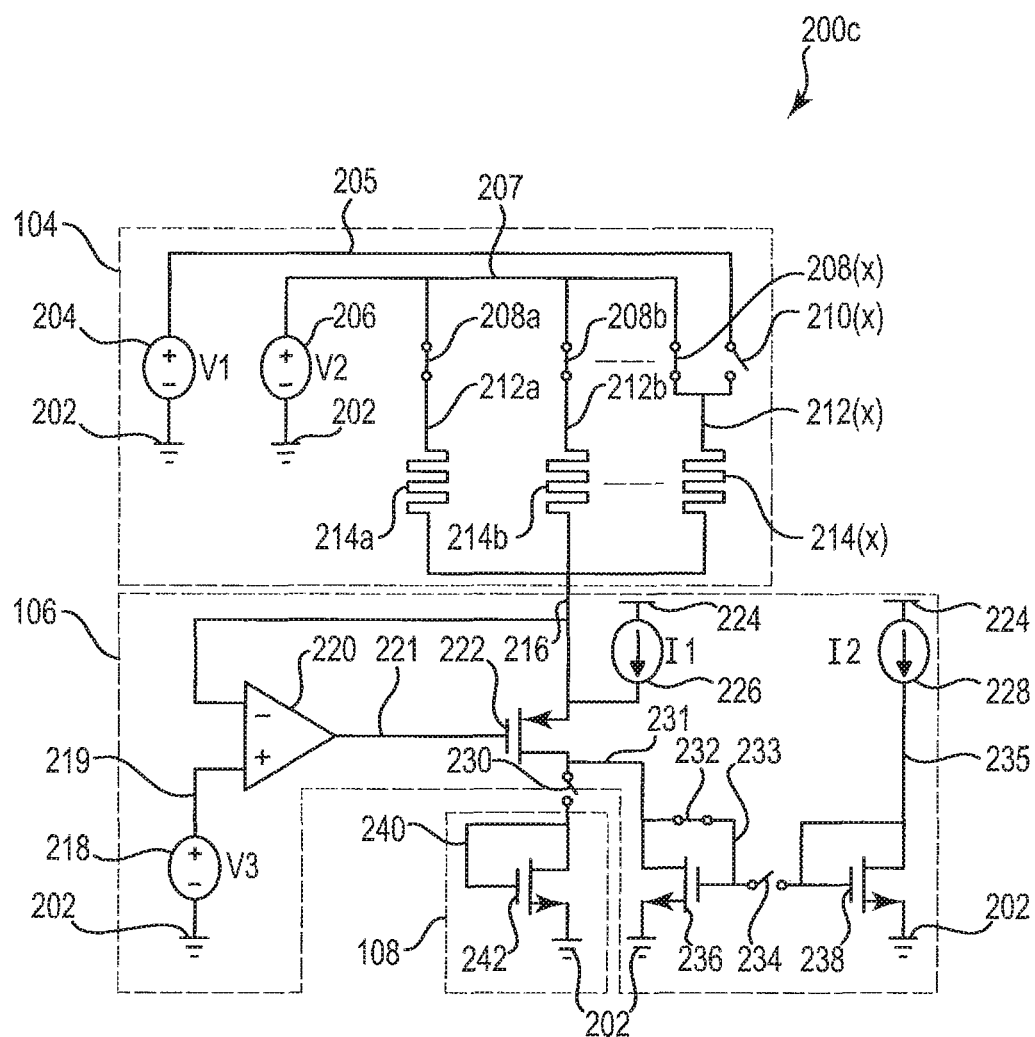

FIGS. 4A-4C are schematic diagrams illustrating one example of system 100 (FIG. 1) in different states. FIG. 4A is a schematic diagram illustrating one example of resistive memory array 104, clamp circuit 106, and sense amplifier 108 in a first state 200a for sampling the leakage current of resistive memory array 104. In this example, resistive memory array 104 includes a one dimensional array of resistive memory cells. Resistive memory array 104 includes a first voltage source (V1) 204, a second voltage source (V2) 206, a first plurality of switches 208a-208(x) (collectively referred to as switches 208), a second plurality of switches (only switch 210(x) is illustrated for simplicity) (collectively referred to as switches 210, and a plurality of resistive memory cells 214a-214(x) (collectively referred to as resistive memory cells 214), where "x" is any suitable number of memory cells. In one example, switches 208 and 210 are transistor switches, such as transmission gates, or other suitable switches controlled by respective control signals.

The negative terminal of first voltage source 204 is electrically coupled to a common or ground 202. The positive terminal of first voltage source 204 is electrically coupled to one side of each switch 210. The other side of each switch 210 is electrically coupled to one side of a respective resistive memory cell 214 through a signal path 212a-212(x). The negative terminal of second voltage source 206 is electrically coupled to common or ground 202. The positive terminal of second voltage source 206 is electrically coupled to one side of each switch 208. The other side of each switch 208 is electrically coupled to one side of a respective resistive memory cell 214 through signal path 212a-212(x). The other side of each resistive memory cell 214 is electrically coupled to signal path 216 (i.e., first node 216).

In this example, in addition to the components previously described and illustrated with reference to FIG. 3, clamp circuit 106 includes switch 230. Switch 230 is electrically coupled between second node 231 and signal path 240 of sense amplifier 108. In another example, switch 230 is excluded and second node 231 is directly electrically coupled to signal path 240 of sense amplifier 108.

Sense amplifier 108 includes a transistor 242. In one example, transistor 242 is an n-channel field effect transistor. One side of the source-drain path of transistor 242 and the gate of transistor 242 are electrically coupled to one side of switch 230 through signal path 240. The other side of the source-drain path of transistor 242 is electrically coupled to common or ground 202.

First voltage source 204 provides a read voltage for sensing the current through a selected resistive memory cell 214 to determine the resistance of the selected resistive memory cell. In one example, first voltage source 204 provides 3V. A memory cell is selected for a read or write operation by closing one switch 210 to electrically connect first voltage source 204 to the selected resistive memory cell 214. The switches 210 for the other non-selected resistive memory cells 214 remain open.

Second voltage source 206 provides a voltage for sensing the leakage current of the resistive memory array. In one example, second voltage source 206 provides a voltage less than first voltage source 204, such as 2V. To sense the leakage current through the resistive memory array, switches 208 are closed and switches 210 are open to electrically connect second voltage source 206 to each resistive memory cell 214. During a read or write operation, the switch 208 for the selected resistive memory cell is opened and the switches 208 for the non-selected resistive memory cells remain closed.

In state 200a, the system is in a sample leakage current state. In the sample leakage current state, switches 208, 230, and 234 are closed, and switches 210 and 232 are open. Thus, transistor 236 mirrors the current provided by second current source 228 to subtract at second node 231 the current added by first current source 226 at first node 216. Therefore, the current sensed by sense amplifier 108 is substantially equal to the leakage current through resistive memory array 104.

FIG. 4B is a schematic diagram illustrating one example of the system in a second state 200b. In state 200b, the system is in a sample current of a selected resistive memory cell state. In this state, switch 208 for the selected resistive memory cell (e.g., 208(x)), switches 210 for the non-selected resistive memory cells (not shown), and switch 232 are open. Switch 210 for the selected resistive memory cell (e.g., 210(x)), switches 208 for the non-selected resistive memory cells (e.g., 208a-208b) and switches 230 and 234 are closed. Thus, clamp circuit 106 is in the same state as previously described and illustrated with reference to FIG. 4A. In this state, however, sense amplifier 108 senses the current through the selected resistive memory cell (e.g. memory cell 214(x)).

FIG. 4C is a schematic diagram illustrating one example of the system in a third state 200c. In state 200c, the system is in a between memory operations state. In one example of this state, switches 208 and 232 are closed, and switches 210, 230, and 234 are open. In another example of this state, switches 208, 230, and 232 are closed, and switches 210 and 234 are open. Thus, transistor 236 is electrically disconnected from second current source 228 and diode connected to provide a load for first current source 226. In the example where switch 230 is excluded or where switch 230 is closed, the current from first current source 226 is split between sense amplifier 108 and diode connected transistor 236.

Figure 5:
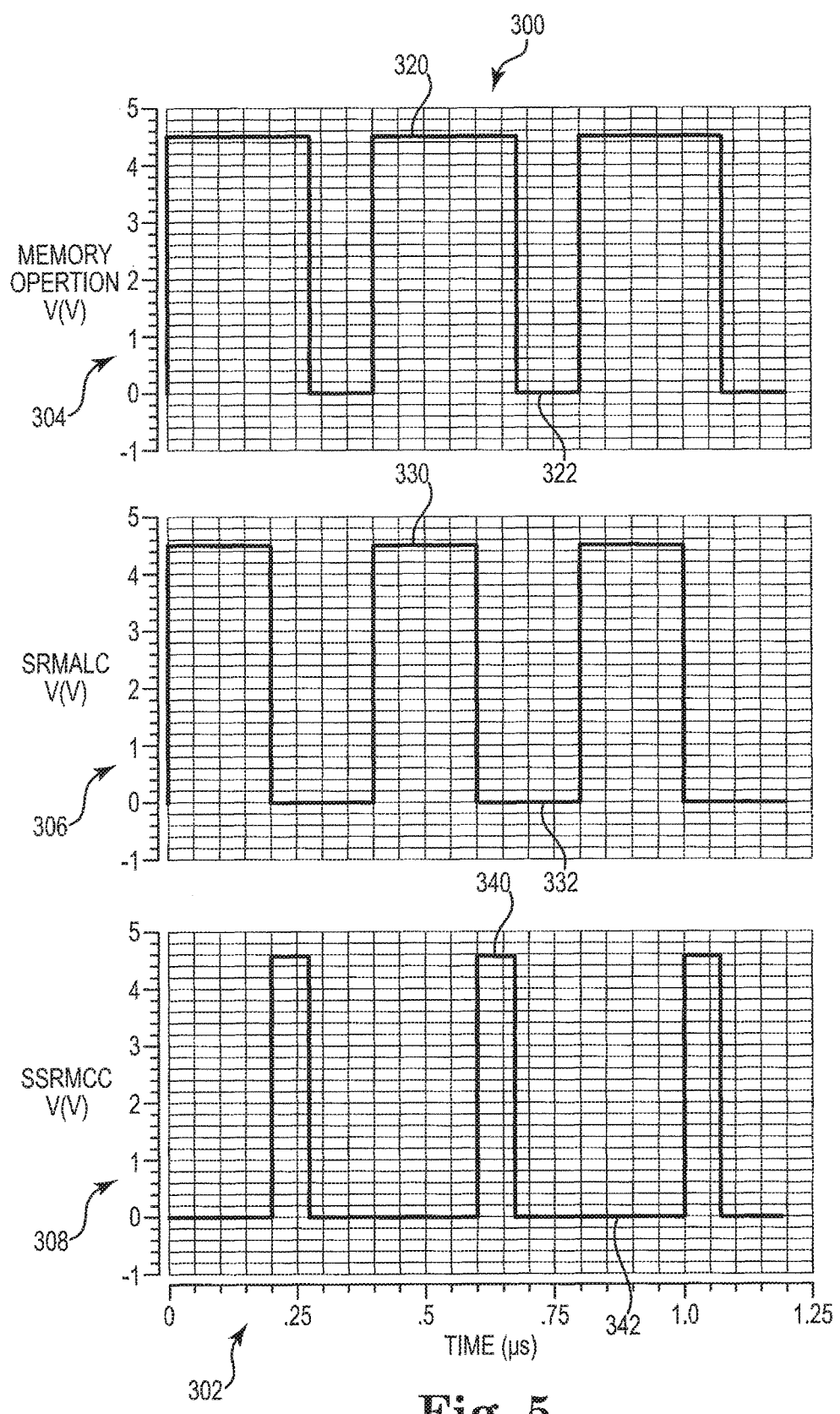
FIG. 5 is a timing diagram illustrating one example of the control signals provided by the controller.

FIG. 5 is a timing diagram 300 illustrating one example of the control signals provided by controller 102 (FIG. 2). Timing diagram 300 includes the memory operation signal, the SRMALC signal, and the SSRMCC signal. Time in microseconds is indicated on the x-axis 302 and voltage in volts is indicated on the respective y-axis 304, 306, and 308 for each signal.

As indicated by timing diagram 300, memory operations are performed during a logic high memory operation signal as indicated for example at 320. Between memory operations, the memory operation signal is logic low as indicated for example at 322. The memory operation signal controls switches 230, 232, and 234 previously described and illustrated with reference to FIGS. 4A-4C. In response to a logic high memory operation signal, switches 230 and 234 are closed and switch 232 is open as illustrated in FIGS. 4A and 4B. In response to a logic low memory operation signal, switches 230 and 234 are open and switch 232 is closed as illustrated in FIG. 4C.

Sampling of the resistive memory array leakage current is performed during a logic high memory operation signal and a logic high SRMALC signal as indicated for example at 330. Between samplings of the resistive memory array leakage current, the SRMALC signal is logic low as indicated for example at 332. The SRMALC signal controls switches 208 previously described and illustrated with reference to FIGS. 4A-4C. In response to a logic high memory operation signal and a logic high SRMALC signal, switches 208 are closed as illustrated in FIG. 4A. In response to a logic high memory operation signal and a logic low SRMALC signal, switch 208 for the selected memory cell is open and switches 208 for the non-selected memory cells are closed as illustrated in FIG. 4B. In response to a logic low memory operation signal and a logic low SRMALC signal, switches 208 are closed as illustrated in FIG. 4C.

Sampling of the current through a selected resistive memory cell is performed during a logic high memory operation signal and a logic high SSRMCC signal as indicated for example at 340. Between samplings of a current through a selected resistive memory cell, the SSRMCC signal is logic low as indicated for example at 342. The SSRMCC signal controls switches 210 previously described and illustrated with reference to FIGS. 4A-4C. In response to a logic high memory operation signal and a logic high SSRMCC signal, switch 210 for the selected memory cell is closed and switches 210 for the non-selected memory cells are open as illustrated in FIG. 4B. In response to a logic high memory operation signal and a logic low SSRMCC signal, switches 210 are open as illustrated in FIG. 4A. In response to a logic low memory operation signal and a logic low SSRMCC signal, switches 208 are open as illustrated in FIG. 4C.

While timing diagram 300 illustrates signals for 400 ns memory operations, clamp circuit 106 is operable and stable for memory operations below 100 ns.

Figure 6A:
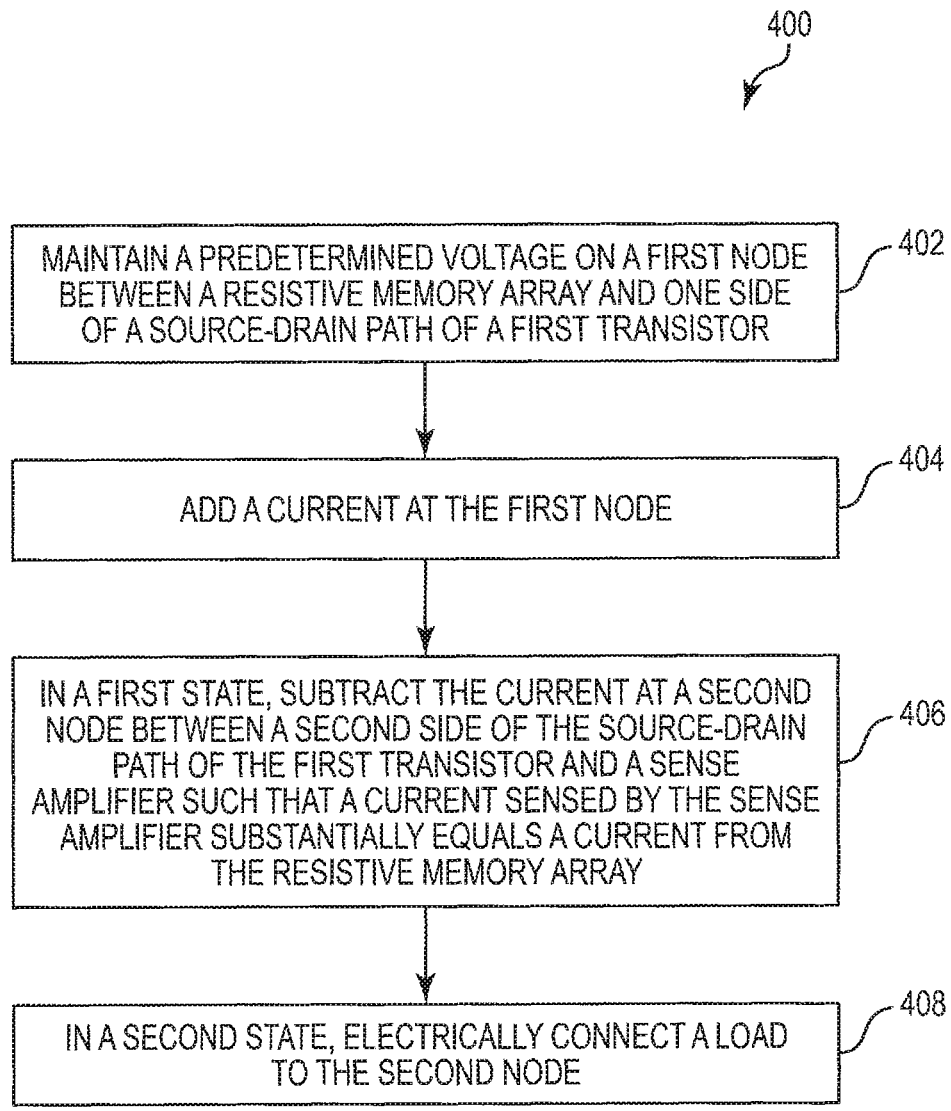
FIGS. 6A-6B are flow diagrams illustrating one example of a process for operating the system.

FIG. 6A is a flow diagram illustrating one example of a process 400 for operating the system. At 402, a predetermined voltage is maintained on a first node between a resistive memory array and one side of a source-drain path of a first transistor. At 404, a current is added at the first node. At 406, in a first state, the current is subtracted at a second node between a second side of the source-drain path of the first transistor and a sense amplifier such that a current sensed by the sense amplifier substantially equals a current from the resistive memory array. At 408, in a second state, a load is electrically connected to the second node.

Figure 6B:
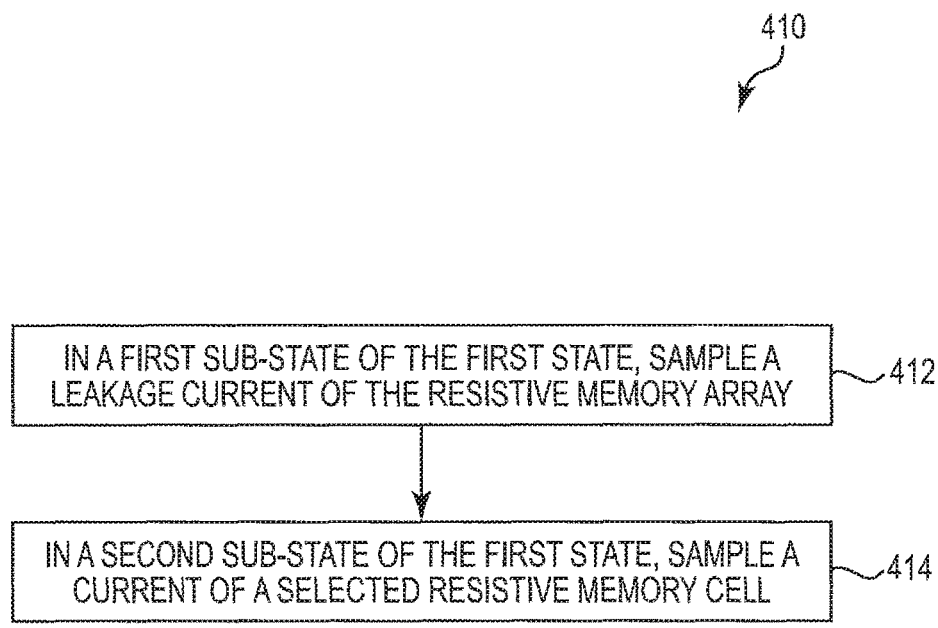

FIG. 6B is a flow diagram illustrating one example of a process 410 for operating the system during the first state of block 406 of process 400 previously described and illustrated with reference to FIG. 6A. At 412, in a first sub-state of the first state, a leakage current of the resistive memory array is sampled. At 414, in a second sub-state of the first state, a current of a selected resistive memory cell is sampled.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A device comprising:
   a first transistor having a source-drain path electrically coupled between a first node and a second node;
   an operational amplifier having an output electrically coupled to a gate of the first transistor, the operational amplifier to control the first transistor to maintain a predetermined voltage on the first node;
   a first current source to add a current at the first node;
   a second current source to subtract the current at the second node;
   a plurality of switches to switch the device between a first state and a second state; and
   a second transistor to mirror the current from the second current source to subtract the current at the second node in the first state and to be diode connected and electrically disconnected from the second current source to provide a load at the second node in the second state.

2. The device of claim 1, further comprising:
a controller to control each of the plurality of switches.

3. The device of claim 1, further comprising:
a sense amplifier to electrically connect to the second node in the first state and to electrically disconnect from the second node in the second state.

4. The device of claim 1, further comprising:
a resistive memory array electrically coupled to the first node.

5. A device comprising:
a resistive memory array;
a sense amplifier; and
a clamp circuit comprising a first transistor having a source-drain path electrically coupled between the resistive memory array and the sense amplifier, a first current source to add a current at a first node between the source-drain path of the first transistor and the resistive memory array, and a second current source to subtract, in a first state, the current from a second node between the source-drain path of the first transistor and the sense amplifier, wherein the clamp circuit comprises a second transistor having a source-drain path, a first side of the source-drain path of the second transistor electrically coupled to the second node, the second transistor to mirror the second current source in the first state and to be electrically disconnected from the second current source and diode connected in a second state.

6. The device of claim 5, wherein the clamp circuit comprises a switch to electrically connect the source-drain path of the first transistor to the sense amplifier in the first state and to electrically disconnect the source-drain path of the first transistor from the sense amplifier in the second state.

7. The device of claim 5, wherein the clamp circuit comprises a switch to electrically connect the second current source to the second transistor in the first state and electrically disconnect the second current source from the second transistor in the second state.

8. The device of claim 5, wherein the clamp circuit comprises a switch such that the second transistor mirrors the second current source to subtract the current in the first state and to diode connect the second transistor in the second state.

9. The device of claim 5, wherein the clamp circuit comprises an operational amplifier having an output electrically coupled to the gate of the first transistor, the operational amplifier to maintain a predetermined voltage at the first node.

10. A method comprising:
maintaining a predetermined voltage on a first node between a resistive memory array and a first side of a source-drain path of a first transistor;
adding a current at the first node;
in a first state, subtracting the current at a second node between a second side of the source-drain path of the first transistor and a sense amplifier such that a current sensed by the sense amplifier substantially equals a current from the resistive memory array;
in a second state, electrically connecting a load to the second node,
in a first sub-state of the first state, sampling via the sense amplifier, a leakage current of the resistive memory array; and
in a second sub-state of the first state, sampling via the sense amplifier, a current of a selected resistive memory cell.

11. The method of claim 10, wherein in the first state, subtracting the current at the second node comprises mirroring a current source via a second transistor; and
wherein in the second state, electrically connecting the load to the second node comprises diode connecting the second transistor and electrically disconnecting the current source from the second transistor.

12. The method of claim 10, wherein maintaining the predetermined voltage on the first node comprises controlling the first transistor via an operational amplifier based on a feedback voltage from the first node and a bias voltage.

* * * * *